United States Patent [19]

McClure et al.

[11] Patent Number: 5,517,455
[45] Date of Patent: May 14, 1996

[54] INTEGRATED CIRCUIT WITH FUSE CIRCUITRY SIMULATING FUSE BLOWING

[75] Inventors: David C. McClure, Carrollton; William C. Slemmer, Dallas, both of Tex.

[73] Assignee: SGS-Thomson Microelectronics, Inc., Carrollton, Tex.

[21] Appl. No.: 220,976

[22] Filed: Mar. 31, 1994

[51] Int. Cl.$^6$ .................................................. G11C 7/00
[52] U.S. Cl. ...................... 365/225.7; 365/200; 365/201; 326/10; 326/16; 326/38; 327/525; 327/526
[58] Field of Search ..................................... 365/96, 225.7, 365/200, 201; 326/10, 16, 38; 327/525, 526

[56] References Cited

U.S. PATENT DOCUMENTS

| | | | |
|---|---|---|---|
| 5,204,559 | 4/1993 | Deyhimy et al. | 327/232 |
| 5,206,583 | 4/1993 | Dawson et al. | 324/158.1 |
| 5,361,001 | 11/1994 | Stolfa | 327/530 |

*Primary Examiner*—David C. Nelms
*Assistant Examiner*—Andrew Q. Tran
*Attorney, Agent, or Firm*—Renee M. Larson; Lisa K. Jorgenson; Richard K. Robinson

[57] ABSTRACT

Fuse circuitry is presented which emulates fuse blowing in a temporary manner. As an embodiment, redundant elements of an integrated circuit may be enabled and/or tested prior to laser repair through the use of non-destructive fuse circuitry which emulates fuse blowing. An integrated circuit has a plurality of addressable elements and a plurality of redundant elements, which may be used to replace defective addressable elements. Each redundant element has a non-destructive fuse circuit associated with it which may be used to enable and/or test the redundant element prior to laser repair by emulating the blowing of a fuse contained in the non-destructive fuse circuit. The non-destructive fuse circuit is comprised of a fuse connected to a control logic element, such as an inverter, wherein the control logic element is in turn controlled by a test signal. Emulation of blowing the fuse or not blowing the fuse is accomplished by the logic level of the test signal. So, rather than connecting the fuse to a power supply, the fuse is connected to the control logic element which is controlled by the test signal. Thus, non-destructive enabling and testing of a redundant element prior to laser repair may be accomplished by emulating blowing or not blowing of the fuse through the control logic element. The fuse can then be permanently blown if desired.

30 Claims, 3 Drawing Sheets

INTEGRATED CIRCUIT WITH FUSE CIRCUITRY SIMULATING FUSE BLOWING

CROSS REFERENCE TO RELATED APPLICATIONS

The subject matter of the present application is related to copending U.S. application, Ser. No. 08/099,606, titled "Redundancy Element Check in IC Memory Without Programming Substitution of Redundant Elements", Docket No.: 92-C-27/28, filed Jul. 30, 1993, assigned to the assignee hereof, which is herein incorporated by reference.

BACKGROUND OF THE INVENTION

The present invention relates generally to integrated circuit devices, and more specifically to integrated circuit devices which have fuse circuitry as a programming means.

A variety of integrated circuit devices, including memories and microprocessors, utilize fuse programming circuitry. For instance, integrated circuit memories have addressable elements which must be replaced by redundant elements free from defect when the addressable elements are faulty in some way. Addressable and redundant elements of an integrated circuit may be defective for a number of reasons well known in the art, such as particle contamination, bit defects, locked rows, and locked columns. An integrated circuit memory, for example, has a plurality of addressable elements, such as rows and columns, and a plurality of redundant elements which may be used to replace defective addressable elements if the redundant elements, themselves, are free of defects. Thus, typically prior to laser repair, it would be desirable to enable and test redundant elements in order to ascertain that the redundant elements are free of defects and therefore suitable for replacing defective addressable elements. Redundant elements are enabled prior to laser repair so that it may be determined whether each redundant element is free of defects and therefore suitable for replacement of defective rows and columns.

Circuitry used to enable redundant elements of an integrated circuit typically has fuse circuitry which controls whether the redundant element will be enabled. Typical fuse circuits are shown in FIGS. 1a and 1b, and these circuits are frequently used to provide master enabling control of redundant elements. Referring to fuse circuitry 10 of FIG. 1a, if fuse 12 is intact, OUT signal 18, after passing through inverters 16 and 17, is a high logic level; if fuse 12 is blown, OUT signal 18 is a low logic level, due to junction leakage and transistor conduction to VSS or ground. OUT signal 18 is connected to redundant element 19 which is enabled when fuse 12 is blown and OUT signal 18 is a logic low level Similarly for fuse circuitry 20 of FIG. 1b, if fuse 22 is intact, OUT signal 28, after passing through inverters 26 and 27, is a low logic level; if fuse 22 is blown, OUT signal 28 is a high logic level, due to junction leakage and transistor conduction to VCC. OUT signal 28 is connected to redundant element 29 and determines whether redundant element 29 will be enabled. When fuse 22 is blown, OUT signal 28 is a high logic level and redundant element 29 is enabled.

It would be desirable to use fuse circuitry similar to that shown in FIGS. 1a and 1b to temporarily enable and then test a redundant element to determine whether it is defective prior to laser repair. Those redundant elements which are found to be defective are logged during laser repair and may be subsequently bypassed and not used to replace a defective addressable element. For example, a defective addressable element may be replaced by two redundant elements, redundant element X and redundant element Y, either one of which may be used to replace the defective addressable element. Using the fuse circuitry described above, it would be desirable to determine prior to laser repair that redundant element X is defective. This information is logged during laser repair so that the defective addressable element is replaced with redundant element Y rather than defective redundant element X.

The circuitry of FIGS. 1a and 1b may be used to control logic gates, as shown in FIG. 2, or to provide multiplexing control, as shown in FIG. 3. Referring to FIG. 2, decoder circuitry 30 employs fuse circuitry 31, which is analogous to fuse circuitry 20 of FIG. 1b and is comprised of fuse 32, transistor 34, and inverters 36 and 38, in order to control passgates 48 and 50. Fuse circuitry 31 produces signal 40 which controls passgates 48 and 50 as shown. Signal 40 controls the p-channel transistor and the n-channel transistor of passgates 48 and 50, respectively. Signal 47 is the inverse of signal 40 and is produced after passing through inverter 46; signal 47 controls the n-channel transistor and the p-channel transistor of passgates 48 and 50, respectively. Addressi' is generated by passgates 48 and 50 as determined by fuse circuitry 31. When fuse 32 is blown, addressi signal 42 is passed through passgate 50, non-inverted, as addressi' signal 52. When fuse 32 is left intact, addressi signal 42 is passed through passgate 48, inverted, as addressi' signal 52. The circuitry so far described is represented by circuitry 57 which is contained within the dashed lines of FIG. 2. Circuitry 57 only performs logic on addressi signal 42, and thus must be duplicated for each of signals addressj, addressk, not shown, in order to produce addressj' signal 54 and addressk' signal 56.

Addressi' signal 52, addressj' signal 54, and addressk' signal 56 are address input signals to NAND gate 68 as shown. Fuse circuitry 65, comprised of master fuse 58, transistor 60, and inverters 62 and 64, is used to enable or disable NAND gate 68. When master fuse 58 is blown, NAND gate 68 is enabled and generates redundant select signal 70 as a function of the address sequence addressi, addressj, addressk, etc. programmed in. Redundant select signal 70 connects to a given redundant element 72, such as a word line which is defined by the address sequence which was programmed in. However, if master fuse 58 is not blown, NAND gate 68 is not enabled and redundant select signal 70 is locked to a high logic level.

Referring to FIG. 3, multiplexing circuitry 80 employs fuse circuitry 82, which is analogous to fuse circuitry 10 of FIG. 1a. Fuse circuitry 82 controls the enabling of redundant element 106 and is comprised of fuse 84, transistor 86, and inverters 88 and 90. Address signals 91a to 91h are input signals to passgates 92a to 92h, respectively, as shown and may be true and complement signals. For example, address signals 91a and 91b may be the complement of each other. The output signals of passgates 92a and 92b pass through fuses 93a and 93b, respectively, before being connected together to form signal 94; the output signals of passgates 92c and 92d pass through fuses 93c and 93d before being connected together to form signal 96; the output signals of passgates 92e and 92f pass through fuses 93e and 93f before being connected together to form signal 98; and the output signals of passgates 92g and 92h pass through fuses 93g and 93h before being connected together to form signal 100. Signals 94, 96, 98, and 100 are input signals to NAND gate 102.

Fuse circuitry 82 controls passgates 92 which in turn control the generation of Redundant Element Select signal 104. Thus, fuse circuitry 82 controls whether multiplexing circuitry 80 is enabled. When fuse 84 of fuse circuitry 82 is blown, passgates 92 are enabled, one of the two fuses 93 associated with each NAND gate input signal 94, 94, 98, or 100 are blown, and the n-channel transistor 95 is off and allows either a true or complement address signal 91, depending on which fuse 93 is blown, to propagate to NAND gate 102 such that Redundant Element Select signal 104 may ultimately be produced. However, when fuse 84 is not blown and is left intact, passgates 92 are not enabled and therefore do not pass through an address signal 91. N-channel transistor 95 pulls the input signal 94, 96, 98, or 100 of NAND gate 102 to a predetermined logic state so that it does not float. As a result, Redundant Element Select signal 104 is never generated and redundant element 106 is not enabled.

FIGS. 2 and 3 illustrate how conventional fuse circuitry 31, 65, and 82, respectively, may be used to provide master enabling control of redundant elements. Enabling of redundant elements is desirable prior to laser repair to ensure that only redundant elements free from defects are used to replace defective rows and/or columns. Unfortunately, the fuse circuitries 10, 20, 31, 65, and 82 of FIG. 1a, 1b, 2, and 3, respectively, require that the enabling and/or testing of redundant elements be performed in a permanent manner, in that a fuse must actually be blown. This process is not reversible. In other words, a fuse which is connected to a first or a second power supply, VCC or VSS, must be blown or not blown in order to provide master enabling control of redundant elements.

SUMMARY OF THE INVENTION

It would be advantageous in the art to employ circuitry which temporarily emulates the effects of fuse blowing without permanently blowing a fuse.

Therefore, according to the present invention, fuse circuitry is presented which emulates fuse blowing in a temporary manner. As an embodiment, redundant elements of an integrated circuit may be enabled and/or tested prior to laser repair through the use of non-destructive fuse circuitry which emulates fuse blowing. An integrated circuit has a plurality of addressable elements and a plurality of redundant elements, which may be used to replace defective addressable elements. Each redundant element has a non-destructive fuse circuit associated with it which may be used to enable and/or test the redundant element prior to laser repair by emulating the blowing of a fuse contained in the non-destructive fuse circuit. The non-destructive fuse circuit is comprised of a fuse connected to a control logic means, such as an inverter, wherein the control logic means is in turn controlled by a test signal. Emulation of blowing the fuse or not blowing the fuse is accomplished by the logic level of the test signal. So, rather than connecting the fuse to a power supply, the fuse is connected to the control logic means which is controlled by the test signal. Thus, non-destructive enabling and testing of a redundant element prior to laser repair may be accomplished by emulating blowing or not blowing of the fuse through the control logic means. The fuse can then be permanently blown if desired.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DESCRIPTION OF THE INVENTION

The present invention emulates the effects of fuse blowing without permanently blowing a fuse and may be used in a variety of devices which utilize fuse circuitry, including integrated circuit memories and microprocessors. For example, the present invention provides for the temporary enabling and testing of redundant elements of an integrated circuit memory device. The present invention may be used in any integrated circuit device which uses fuse circuitry as a programming means for enabling and testing redundant elements, such as an integrated circuitry memory device or a microprocessor. Generally speaking, the present invention emulates the fuse blowing of fuse circuitry currently used in the art. The fuse circuitries shown in FIGS. 4a and 4b illustrate how non-destructive emulation of fuse blowing may be achieved.

Figure 1A:
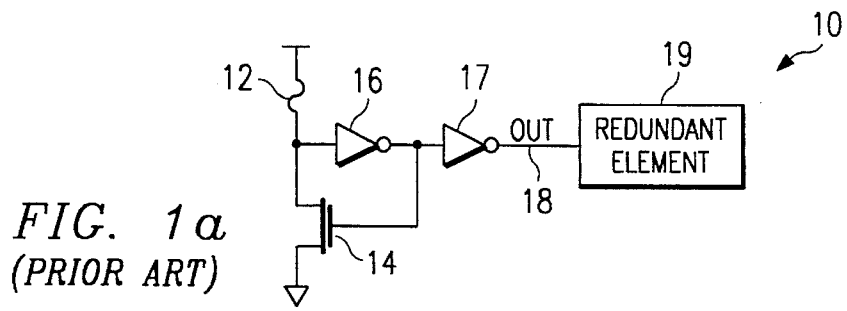
FIG. 1a is a first example of fuse circuitry used to control a redundant element of an integrated circuit, according to current practice in the art.
Figure 1B:
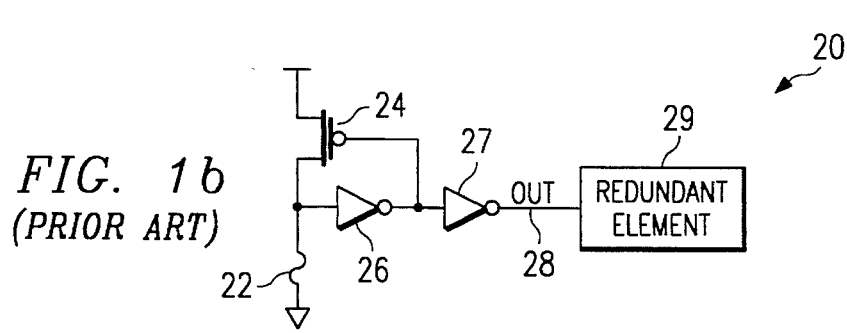
FIG. 1b is a second example of fuse circuitry used to control a redundant element of an integrated circuit, according to current practice in the art.
Figure 4A:
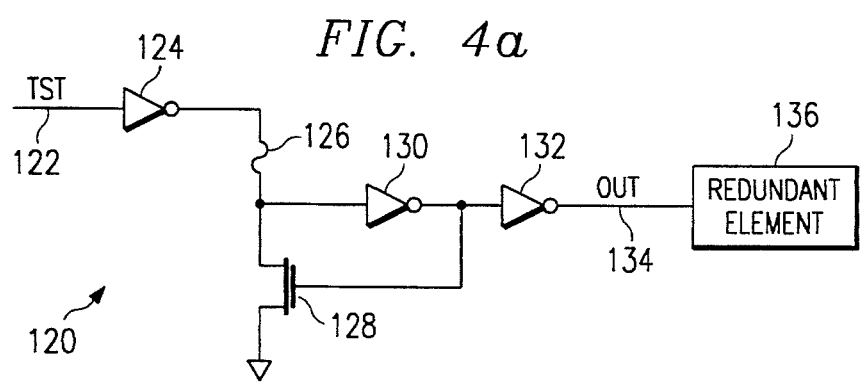
FIG. 4a is non-destructive circuitry for emulating blowing a fuse, according to a first preferred embodiment of the present invention.
Figure 4B:
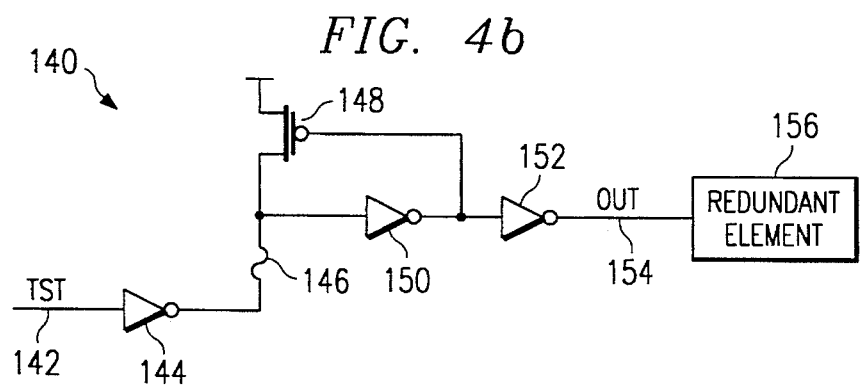
FIG. 4b is non-destructive circuitry for emulating blowing a fuse, according to a second preferred embodiment of the present invention.
Figure 2:
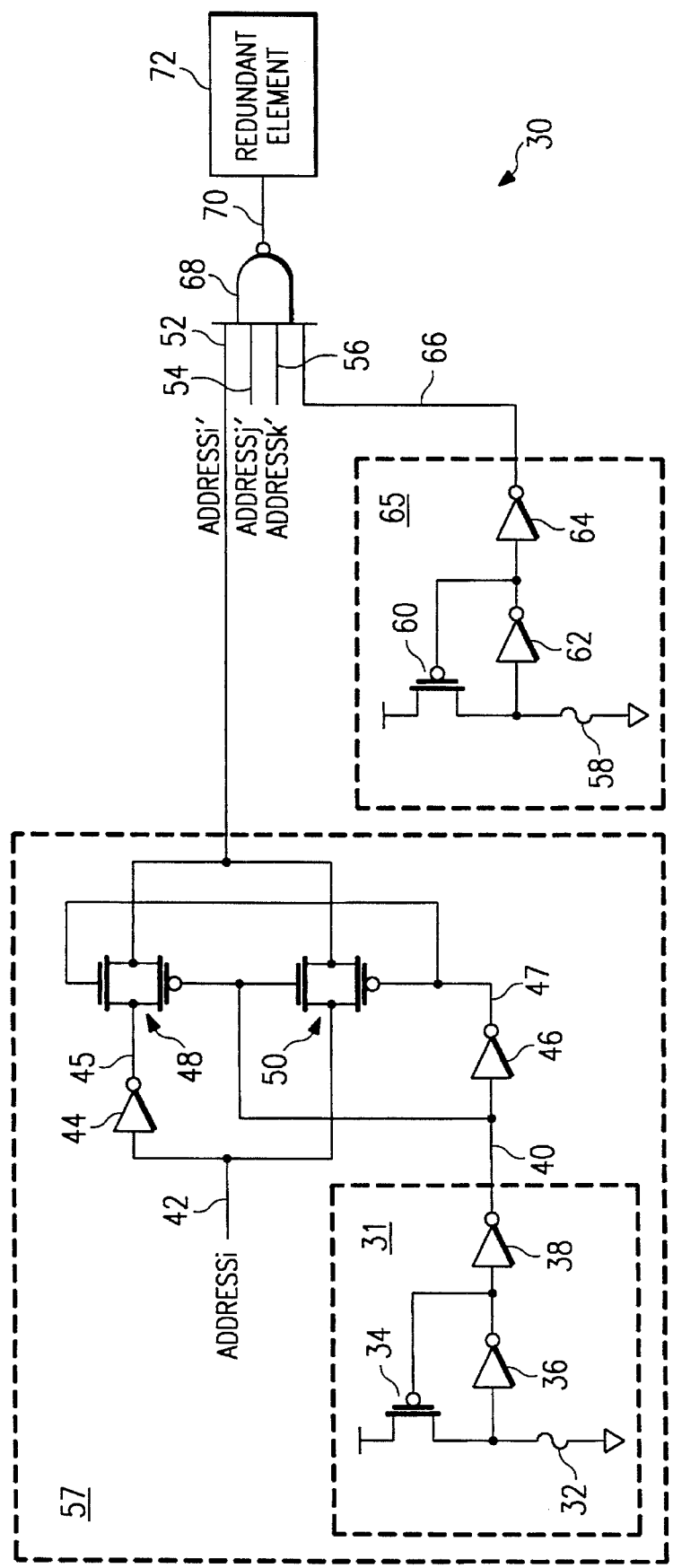
FIG. 2 is fuse circuitry which controls logic gates in order to control redundant element of an integrated circuit, according to current practice in the art.
Figure 3:
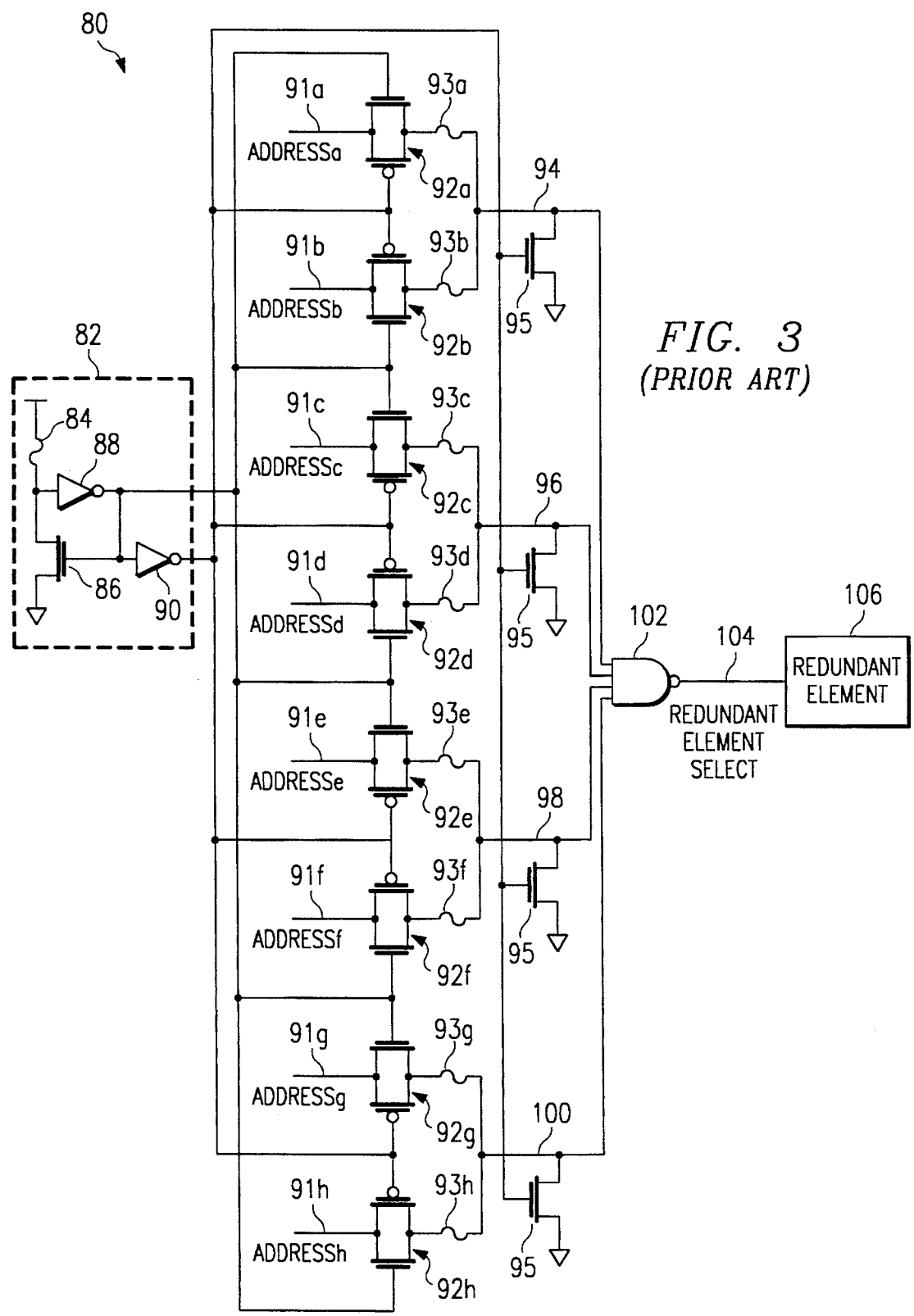
FIG. 3 is fuse circuitry which provides multiplexing control in order to control a redundant element of an integrated circuit, according to current practice in the art.

Referring to FIG. 4a, non-destructive fuse circuit 120 is shown. Destructive fuse blowing means actually blowing a fuse which provides permanent programming. Whereas, non-destructive fuse blowing emulates blowing a fuse and is a temporary programming procedure. Non-destructive fuse circuit 120 is associated with redundant element 136 and allows redundant element 136 to be temporarily enabled in order to determine whether redundant element 136 is or is not defective if desired. Thus, a integrated circuit memory device according to the present invention having a plurality of addressable elements, such as rows and columns, and a plurality of redundant elements would also have a plurality of non-destructive fuse circuits 120, wherein non-destructive fuse circuit 120 would be associated with redundant element 136.

Non-destructive fuse circuit 120 is comprised of TST test signal 122, inverter 124, fuse 126, NMOS transistor 128 connected to ground potential VSS, inverters 130 and 132, and OUT signal 134. Rather than connecting fuse 126 to power supply VCC, as described in the Background of the Invention, fuse 126 is connected to control logic means, represented here by inverter 124. Besides inverter 124, the control logic means may be any logic gate such as a NAND gate well known in the art. Inverter 124 is controlled by TST test signal 122 and the logic level of TST test signal 122 is indicative of whether a test mode has been entered into. Thus TST test signal 122 may often be the derivative signal of some test mode operation.

In order to emulate blowing fuse 126, TST test signal 122 is brought to a high logic level. TST test signal 122 propagates through inverters 130 and 132 and OUT signal 134 is a low logic level, which is the same logic level for OUT signal 134 if fuse 126 had been blown. OUT signal 134 enables redundant element 136, to which it is connected. In this way, redundant element 136 may be enabled and thus tested without employing destructive means such as blowing a fuse.

During normal operation, TST test signal 122 is simply kept at a low logic level and fuse 126 may or may not be blown. Inverter 124 should be sized such that during this normal operation when TST test signal 122 is a low logic level, fuse 126 and inverter 124 may easily overcome transistor 128, if there is any contention between fuse 126, inverter 124 and transistor 128.

Referring to FIG. 4b, non-destructive fuse circuit 140 is shown. Non-destructive fuse circuit 140 is similar to non-destructive fuse circuit 120 but is used where the opposite polarity of an OUT signal is required. Non-destructive fuse circuit 140 is comprised of TST test signal 142, inverter 144, fuse 146, PMOS transistor 148 connected to VCC, inverters 150 and 152, and OUT signal 154. Inverter 144 is controlled by TST test signal 142 and the logic level of TST test signal 142 is indicative of whether a test mode has been entered into. Thus TST test signal 142 may often be the derivative signal of some test mode operation.

In order to emulate blowing fuse 146, TST test signal 142 is brought to a low logic level. TST test signal 142 propagates through inverters 150 and 152 and OUT signal 154 is a high logic level, which is the same logic level for OUT signal 154 if fuse 146 had been blown. OUT signal 154 enables redundant element 156 to which it is connected. In this way, redundant element 156 may be enabled and thus tested without employing destructive means such as blowing a fuse.

During normal operation, TST test signal 142 is simply kept at a high logic level and fuse 146 may or may not be blown. Inverter 144 should be sized such that during this normal operation when TST test signal 142 is a high logic level, fuse 146 and inverter 144 may easily overcome transistor 148, if there is any contention between fuse 146, inverter 144 and transistor 148.

The non-destructive fuse circuitries 120 and 140 of FIGS. 4a and 4b, respectively, allow redundant elements of an integrated circuit device, such as a memory or a microprocessor, to be enabled and then tested prior to laser repair of the integrated circuit device without destructively blowing fuses. It is important to note that the present invention may be used to emulate fuse blowing for any fuse-based circuitry, however. The present invention provides an efficient way to emulate fuse blowing and requires little additional layout area. Also, additional circuitry may be added to fuse circuitries 120 and 140 of FIGS. 4a and 4b in order to provide proper initialization of the device upon power up, without departing from the spirit and scope of the invention.

While the invention has been particularly shown and described with reference to a preferred embodiment, it will be understood by those skilled in the art that various changes in form and detail may be made therein without departing from the spirit and scope of the invention.

What is claimed is:

1. A non-destructive fuse circuit capable of simulating blowing a fuse, comprising:

the fuse;

a control logic means connected to the fuse, wherein an output signal of the control logic means is connected to a first terminal of the fuse, a second terminal of the fuse is connected to a first terminal of a transistor, a second terminal of the transistor is connected to a voltage supply, and an input of a first inverter is connected to the second terminal of the fuse, and an output of the first inverter is connected to a third terminal of the transistor; and a signal coupled to the control logic means which controls the control logic means such that when the signal is brought to a first logic level, blowing of the fuse is simulated.

2. The circuit of claim 1, wherein when the signal is the first logic level, the output of the first inverter is the first logic level, and the non-destructive fuse circuit simulates blowing the fuse.

3. The circuit of claim 1, wherein the signal is a derivative signal of a test mode operation.

4. The circuit of claim 1, wherein the control logic means is a second inverter.

5. The circuit of claim 4, wherein the second inverter is sized so that when the signal is a second logic level, the fuse and the second inverter can overcome the transistor if there is any contention between the fuse, the second inverter, and transistor.

6. The circuit of claim 1, wherein the non-destructive fuse circuit is suitable for use in an integrated circuit memory device.

7. The circuit of claim 1, wherein the non-destructive fuse circuit is suitable for use in a microprocessor.

8. The circuit of claim 1, wherein the transistor is a MOS transistor having a gate, a source, and a drain, and the first terminal of the transistor is the drain, the second terminal of the transistor is the source, and the third terminal of the transistor is the gate.

9. The circuit of claim 8, wherein the transistor is a NMOS transistor and the voltage supply is Vss.

10. The circuit of claim 8, wherein the transistor is a PMOS transistor and the voltage supply is Vcc.

11. The circuit of claim 1, further comprising:

a plurality of addressable elements;

a plurality of redundant elements; and a plurality of non-destructive fuse circuits, wherein each non-destructive fuse circuit is connected to a redundant element such that when the non-destructive fuse circuit simulates blowing the fuse, the redundant element may be enabled and may be tested to determine whether the redundant element is suitable for replacing a defective addressable element.

12. The circuit of claim 11, wherein the non-destructive fuse circuit comprises the signal, and when the signal is brought to the first logic level, the non-destructive fuse circuit simulates blowing the fuse so that the redundant element may be enabled.

13. The circuit of claim 12, wherein when the signal is the first logic level, the output of the first inverter is the first logic level, the non-destructive fuse circuit simulates blowing the fuse, and the redundant element may be enabled.

14. The circuit of claim 11, wherein the redundant element is enabled and tested prior to a laser repair step.

15. The circuit of claim 11, wherein the non-destructive fuse circuit is suitable for use in an integrated circuit memory device.

16. A method of simulating blowing a fuse, comprising the steps of:

applying a signal to a control logic means which is connected to the fuse, wherein an output signal of the controls logic means is connected to a first terminal of the fuse, a second terminal of the fuse is connected to a first terminal of a transistor, a second terminal of the transistor is connected to a voltage supply, an input of a first inverter is connected to the second terminal of the fuse, and an output of the first inverter is connected to a third terminal of the transistor; and bringing the signal to a first logic level so that blowing the fuse is simulated.

17. The method of claim 16, wherein when the signal is the first logic level, the output of the first inverter is the first logic level, and blowing the fuse is simulated.

18. The method of claim 16, wherein the signal is a derivative signal of a test mode operation.

19. The method of claim 16, wherein the control logic means is a second inverter.

20. The method of claim 19, wherein the second inverter is sized so that when the signal is a second logic level, the fuse and the second inverter can overcome the transistor if there is any contention between the fuse, the second inverter, and transistor.

21. The method of claim 16, wherein the method is suitable for use in an integrated circuit memory device.

22. The method of claim 16, wherein the method is suitable for use in a microprocessor.

23. The method of claim 16, wherein the transistor is a MOS transistor having a gate, a source, and a drain, and the first terminal of the transistor is the drain, the second terminal of the transistor is the source, and the third terminal of the transistor is the gate.

24. The method of claim 23, wherein the transistor is a NMOS transistor and the voltage supply is Vss.

25. The method of claim 23, wherein the transistor is a PMOS transistor and the voltage supply is Vcc.

26. The method of claim 16, wherein the output of the first inverter controls a redundant element, and bringing the signal to the first logic level allows the redundant element to be enabled.

27. The method of claim 26, wherein when the signal is the first logic level, the output of the first inverter is the first logic level, the control logic means simulates blowing the fuse, and the redundant element may be enabled.

28. The method of claim 27, wherein after the redundant element is enabled, comprising the further step of:

testing the redundant element, prior to a laser repair step, to determine whether the redundant element is suitable for replacing a defective addressable element.

29. The method of claim 28, wherein the redundant element is enabled and tested prior to the laser repair step.

30. The method of claim 26, wherein the method of simulating blowing the fuse is suitable for use in an integrated circuit memory device.

* * * * *